(12) United States Patent
Zhan et al.

(10) Patent No.: US 12,196,896 B2
(45) Date of Patent: Jan. 14, 2025

(54) DETECTION PANEL, METHOD FOR MANUFACTURING THE SAME AND FLAT PANEL DETECTOR

(71) Applicants: Beijing BOE Sensor Technology Co., Ltd., Beijing (CN); BOE TECHNOLOGY GROUP CO., LTD., Beijing (CN)

(72) Inventors: Xiangmi Zhan, Beijing (CN); Zhenyu Wang, Beijing (CN); Xuecheng Hou, Beijing (CN)

(73) Assignees: Beijing BOE Sensor Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 585 days.

(21) Appl. No.: 17/488,616

(22) Filed: Sep. 29, 2021

(65) Prior Publication Data

US 2022/0171079 A1 Jun. 2, 2022

(30) Foreign Application Priority Data

Nov. 27, 2020 (CN) .......................... 202011363879.8

(51) Int. Cl.
*H01L 27/146* (2006.01)
*G01T 1/24* (2006.01)

(52) U.S. Cl.
CPC ........ *G01T 1/241* (2013.01); *H01L 27/14623* (2013.01); *H01L 27/14636* (2013.01); *H01L 27/14659* (2013.01); *H01L 27/14689* (2013.01)

(58) Field of Classification Search
CPC .............. G01T 1/241; H01L 27/14659; H01L 27/14689
See application file for complete search history.

(56) References Cited

U.S. PATENT DOCUMENTS

| | | | |
|---|---|---|---|
| 7,902,512 B1* | 3/2011 | Chang | H01L 27/14603 250/370.01 |
| 8,983,036 B2* | 3/2015 | Tredwell | H04N 25/77 378/114 |
| 9,097,809 B2* | 8/2015 | Tredwell | G01T 1/20184 |
| 9,570,645 B2* | 2/2017 | Zhao | H01L 31/18 |
| 9,647,019 B2* | 5/2017 | Gao | H01L 27/14623 |
| 9,735,194 B2* | 8/2017 | Gao | G01T 1/20184 |

(Continued)

*Primary Examiner* — Mounir S Amer
*Assistant Examiner* — Alexander Belousov
(74) *Attorney, Agent, or Firm* — HOUTTEMAN LAW LLC

(57) ABSTRACT

There is provided a detection panel, including: a substrate, gate lines, signal detection lines and pixels, a thin film transistor and an optical sensor are arranged in each pixel, the thin film transistor has a gate coupled with the corresponding gate line, a first electrode coupled with the corresponding signal detection line, and a second electrode coupled with a third electrode of the optical sensor in the same pixel; the pixels include at least one detecting pixel and at least one marking pixel, a first bias voltage line and a second bias voltage line are arranged on a side of the optical sensor away from the substrate, a fourth electrode of the optical sensor in the detecting pixel is coupled with the corresponding first bias voltage line, and the second electrode of the thin film transistor in the marking pixel is coupled with the corresponding second bias voltage line.

20 Claims, 12 Drawing Sheets

(56) References Cited

U.S. PATENT DOCUMENTS

| | | | | |
|---|---|---|---|---|
| 10,297,635 B2* | 5/2019 | Gao | | H01L 27/14685 |
| 10,690,786 B2* | 6/2020 | Tian | | H01L 31/202 |
| 10,784,305 B2* | 9/2020 | Huang | | H01L 27/14689 |
| 10,964,745 B2* | 3/2021 | Ha | | G01T 1/2006 |
| 11,094,737 B2* | 8/2021 | Hou | | H01L 27/14612 |
| 11,125,894 B2* | 9/2021 | Zhang | | H01L 27/14603 |
| 11,158,657 B2* | 10/2021 | Xie | | H01L 29/78669 |
| 11,195,875 B2* | 12/2021 | Lin | | H01L 27/14603 |
| 11,275,185 B2* | 3/2022 | Liang | | G01T 1/20185 |
| 11,355,534 B2* | 6/2022 | Hou | | H01L 27/14692 |
| 11,366,240 B2* | 6/2022 | Liang | | H01L 27/14689 |
| 11,404,469 B2* | 8/2022 | Zhang | | H01L 27/14636 |
| 11,515,354 B2* | 11/2022 | Yoon | | H01L 27/14612 |
| 11,567,222 B2* | 1/2023 | Hua | | G01T 1/20184 |
| 11,614,551 B2* | 3/2023 | Shang | | H01L 27/14663 250/370.09 |
| 11,698,468 B2* | 7/2023 | Su | | G01T 1/2018 250/362 |
| 11,715,746 B2* | 8/2023 | Hou | | H01L 27/14612 257/72 |
| 11,830,895 B2* | 11/2023 | Meng | | H01L 27/14612 |
| 11,948,948 B2* | 4/2024 | Chen | | H01L 27/14658 |
| 11,961,935 B2* | 4/2024 | Shang | | H01L 31/1868 |
| 2009/0026509 A1* | 1/2009 | Hayashi | | H01L 31/022408 257/292 |
| 2009/0267121 A1* | 10/2009 | Ishida | | H01L 27/14658 257/292 |
| 2013/0001426 A1* | 1/2013 | Tredwell | | G01T 1/20184 250/370.09 |
| 2013/0170620 A1* | 7/2013 | Tredwell | | H04N 23/30 378/91 |
| 2015/0160352 A1* | 6/2015 | Tredwell | | H04N 23/30 378/98.8 |
| 2015/0270299 A1* | 9/2015 | Gao | | H01L 27/14623 257/66 |
| 2016/0336373 A1* | 11/2016 | Gao | | H01L 27/14663 |
| 2016/0359075 A1* | 12/2016 | Zhao | | H01L 27/14663 |
| 2017/0186809 A1* | 6/2017 | Gao | | H01L 29/458 |
| 2018/0239034 A1* | 8/2018 | Tian | | G01T 1/20183 |
| 2019/0049597 A1* | 2/2019 | Tian | | H01L 31/202 |
| 2020/0058699 A1* | 2/2020 | Lin | | H01L 27/14605 |
| 2020/0200925 A1* | 6/2020 | Jeon | | G01T 1/244 |
| 2020/0219917 A1* | 7/2020 | Xie | | H01L 29/78669 |
| 2020/0258935 A1* | 8/2020 | Huang | | H01L 27/14616 |
| 2020/0259034 A1* | 8/2020 | Huang | | H01L 31/105 |
| 2021/0149063 A1* | 5/2021 | Liang | | H01L 27/14663 |
| 2021/0159262 A1* | 5/2021 | Hou | | H01L 27/14612 |
| 2021/0215835 A1* | 7/2021 | Zhang | | H01L 27/14623 |
| 2021/0288101 A1* | 9/2021 | Zhang | | H01L 27/14663 |
| 2021/0364662 A1* | 11/2021 | Hua | | G01T 1/20184 |
| 2021/0384236 A1* | 12/2021 | Hou | | H01L 27/14658 |
| 2022/0093658 A1* | 3/2022 | Chen | | H01L 27/14614 |
| 2022/0131025 A1* | 4/2022 | Shang | | H01L 31/1868 |
| 2022/0163684 A1* | 5/2022 | Shang | | H01L 27/14663 |
| 2022/0171079 A1* | 6/2022 | Zhan | | G01T 1/241 |
| 2022/0278146 A1* | 9/2022 | Hou | | H01L 27/12 |
| 2023/0097928 A1* | 3/2023 | Su | | H01L 27/14663 250/362 |
| 2023/0176238 A1* | 6/2023 | Shang | | H01L 27/14663 250/370.09 |
| 2023/0299097 A1* | 9/2023 | Hou | | H01L 27/14692 257/72 |
| 2024/0170505 A1* | 5/2024 | Meng | | A61B 6/00 |
| 2024/0178339 A1* | 5/2024 | Shang | | H01L 27/14612 |
| 2024/0194705 A1* | 6/2024 | Zhan | | H01L 27/14659 |
| 2024/0248217 A1* | 7/2024 | Shang | | H01L 27/14663 |

* cited by examiner (a)

(b)

(c)

(d)

(e)

DETECTION PANEL, METHOD FOR MANUFACTURING THE SAME AND FLAT PANEL DETECTOR

CROSS REFERENCE TO RELATED APPLICATIONS

This application claims the priority to Chinese patent application No. 202011363879.8, filed at the Chinese Intellectual Property Office on Nov. 27, 2020, the disclosure of which is incorporated herein by reference in its entirety.

TECHNICAL FIELD

The present disclosure relates to the field of image detection, and more particularly to a detection panel, a method for manufacturing the detection panel and a flat panel detector.

BACKGROUND

X-ray detection is widely applied to modern medical image detection, and currently, the most advanced direct Digital Radiography (DR) is a technology of directly converting X-ray information into digital image information by using a one-dimensional or two-dimensional X-ray detector under the control of a computer with an image processing function. Two-dimensional flat panel X-ray detectors (FPXDs) mainly used in current DR apparatuses include direct flat panel detectors and indirect flat panel detectors.

SUMMARY

In a first aspect, an embodiment of the present disclosure provides a detection panel, including: a substrate; a plurality of gate lines extending in a first direction on the substrate; a plurality of signal detection lines extending in a second direction on the substrate, the second direction being different from the first direction; an array of pixels defined by the plurality of gate lines and the plurality of signal detection lines and located on the substrate, where the array of pixels includes a plurality of pixels each having a thin film transistor and an optical sensor disposed therein, the optical sensor includes a third electrode, a fourth electrode and a photosensitive pattern located between the third electrode and the fourth electrode, a gate of the thin film transistor is electrically coupled to one of the gate lines corresponding thereto, a first electrode of the thin film transistor is electrically coupled to one of the signal detection lines corresponding thereto, and a second electrode of the thin film transistor is electrically coupled to the third electrode of the optical sensor located in the same pixel; and the plurality of pixels include at least one detecting pixel and at least one marking pixel; and a first bias voltage line and a second bias voltage line located on a side of the optical sensor away from the substrate, the first bias voltage line and the second bias voltage line are intersected with and insulated from each other, where the fourth electrode of the optical sensor in the detecting pixel is electrically coupled to the first bias voltage line corresponding thereto, and the second electrode of the thin film transistor in the marking pixel is electrically coupled to the second bias voltage line corresponding thereto.

In some implementations, a direction in which the first bias voltage line extends is parallel to a direction in which the signal detection line extends; a direction in which the second bias voltage line extends is parallel to a direction in which the gate line extends.

In some implementations, the second bias voltage line includes a plurality of first conductive portions arranged at intervals along the first direction, a conductive bridge line connecting adjacent ones of the first conductive portions and at least one second conductive portion; the first conductive portions and the second conductive portion are arranged in the same layer as the first bias voltage line, the conductive bridge line is located on a side of the first bias voltage line away from the substrate and insulated from the first bias voltage line, an end of the second conductive portion is directly coupled with the first conductive portion, and another end of the second conductive portion extends into the marking pixel corresponding thereto and is electrically coupled with the second electrode of the thin film transistor in the marking pixel.

In some implementations, the detection panel further includes an insulating protective layer located on a side of the first bias voltage line away from the substrate, and a transparent shielding electrode pattern located on the insulating protective layer, where the conductive bridge line and the transparent shielding electrode pattern are arranged in a same layer and are insulated from each other.

In some implementations, the another end of the second conductive portion extends into the marking pixel corresponding thereto and is coupled to the third electrode of the optical sensor in the marking pixel through a via hole.

In some implementations, an orthographic projection of the first conductive portion on the substrate is located within a region where an orthographic projection of the gate line on the substrate is located.

In some implementations, in the array of pixels, a row of pixels including the marking pixel is a specific row of pixels, and all marking pixels located in the same specific row of pixels correspond to the same second bias voltage line.

In some implementations, in the array of pixels, there are two adjacent specific rows of pixels in which all the marking pixels correspond to the same second bias voltage line.

In some implementations, the detection panel includes at least one marking region in which at least two marking pixels are disposed; in the same marking region, for any marking pixel, there is at least one another marking pixel adjacent thereto both in a row direction and a column direction, there is no marking pixel located in the same row as the marking pixel and adjacent to the marking pixel in the column direction, and there is no marking pixel located in the same column as the marking pixel and adjacent to the marking pixel in the row direction.

In some implementations, in the same marking region, the marking pixels are arranged in an oblique line, a direction in which the oblique line extends intersects with both the row direction and the column direction;
   or, in the same marking region, the marking pixels are arranged in a V shape;
   or, in the same marking region, the marking pixels are arranged in an inverted V shape;
   or, in the same marking region, the marking pixels are arranged in a diamond shape;
   or, in the same marking region, the marking pixels are arranged in an X shape.

In some implementations, the detection panel further includes: a light-shielding pattern located on a side of the thin film transistor away from the substrate, an orthographic projection of the light-shielding pattern on the substrate completely covers an orthographic projection of an active layer pattern in the thin film transistor on the substrate, and the light-shielding pattern and the first bias voltage line are arranged in a same layer.

In some implementations, the fourth electrode of the optical sensor in the marking pixel is further electrically coupled to the first bias voltage line.

In some implementations, the first bias voltage line is configured to transmit a first bias voltage and the second bias voltage line is configured to transmit a second bias voltage, a magnitude of the first bias voltage is different from a magnitude of the second bias voltage.

In a second aspect, an embodiment of the present disclosure provides a flat panel detector including the detection panel provided in the first aspect.

In a third aspect, an embodiment of the present disclosure provides a method for manufacturing the detection panel provided in the first aspect, including:

providing a substrate;

forming a plurality of gate lines, a plurality of signal detection lines, and a plurality of pixels on the substrate, each pixel being provided therein with a thin film transistor and an optical sensor, the optical sensor including a third electrode, a fourth electrode, and a photosensitive pattern located between the third electrode and the fourth electrode, a gate of the thin film transistor being electrically coupled to one of the gate lines corresponding thereto, a first electrode of the thin film transistor being electrically coupled to one of the signal detection lines corresponding thereto, a second electrode of the thin film transistor being electrically coupled to the third electrode of the optical sensor located in the same pixel, and the plurality of pixels including at least one detecting pixel and at least one marking pixel; and forming a first bias voltage line and a second bias voltage line on a side of the optical sensor away from the substrate, the first bias voltage line and the second bias voltage line being intersected with and insulated from each other, where the fourth electrode of the optical sensor in the detecting pixel being electrically coupled to the first bias voltage line corresponding thereto, and the second electrode of the thin film transistor in the marking pixel being electrically coupled to the second bias voltage line corresponding thereto.

In some implementations, the forming the first bias voltage line and the second bias voltage line on the side of the optical sensor away from the substrate includes:

forming a planarization layer on a side of the optical sensor away from the substrate, the planarization layer having a first via hole communicating with the fourth electrode of the optical sensor in the detecting pixel and a second via hole communicating with the third electrode of the optical sensor in the marking pixel;

forming a bias voltage line layer on a side of the planarization layer away from the substrate through a patterning process, where the bias voltage line layer includes:

the first bias voltage line, the first conductive portions, and the second conductive portion, the first bias voltage line being coupled to the fourth electrode of the optical sensor corresponding thereto through the first via hole, and the second conductive portion being coupled to the third electrode of the optical sensor corresponding thereto through the second via hole;

forming an insulating protective layer on a side of the bias voltage line layer away from the substrate, where third via holes communicating with the first conductive portions are formed in the insulating protective layer; and forming a transparent electrode layer on a side of the insulating protection layer away from the substrate, where the transparent electrode layer including the conductive bridge line, the conductive bridge line being coupled with two adjacent ones of the first conductive portions corresponding thereto through the third via holes so as to realize an electric connection between the adjacent ones of the first conductive portions.

In some implementations, the transparent electrode layer further includes a transparent shielding electrode pattern.

DRAWINGS

DETAILED DESCRIPTION

In order to make those skilled in the art better understand the technical solution of the present disclosure, a detection panel, a method for manufacturing the detection panel, and a flat panel detector provided by the present disclosure are described in detail below with reference to the accompanying drawings.

Figure 1:
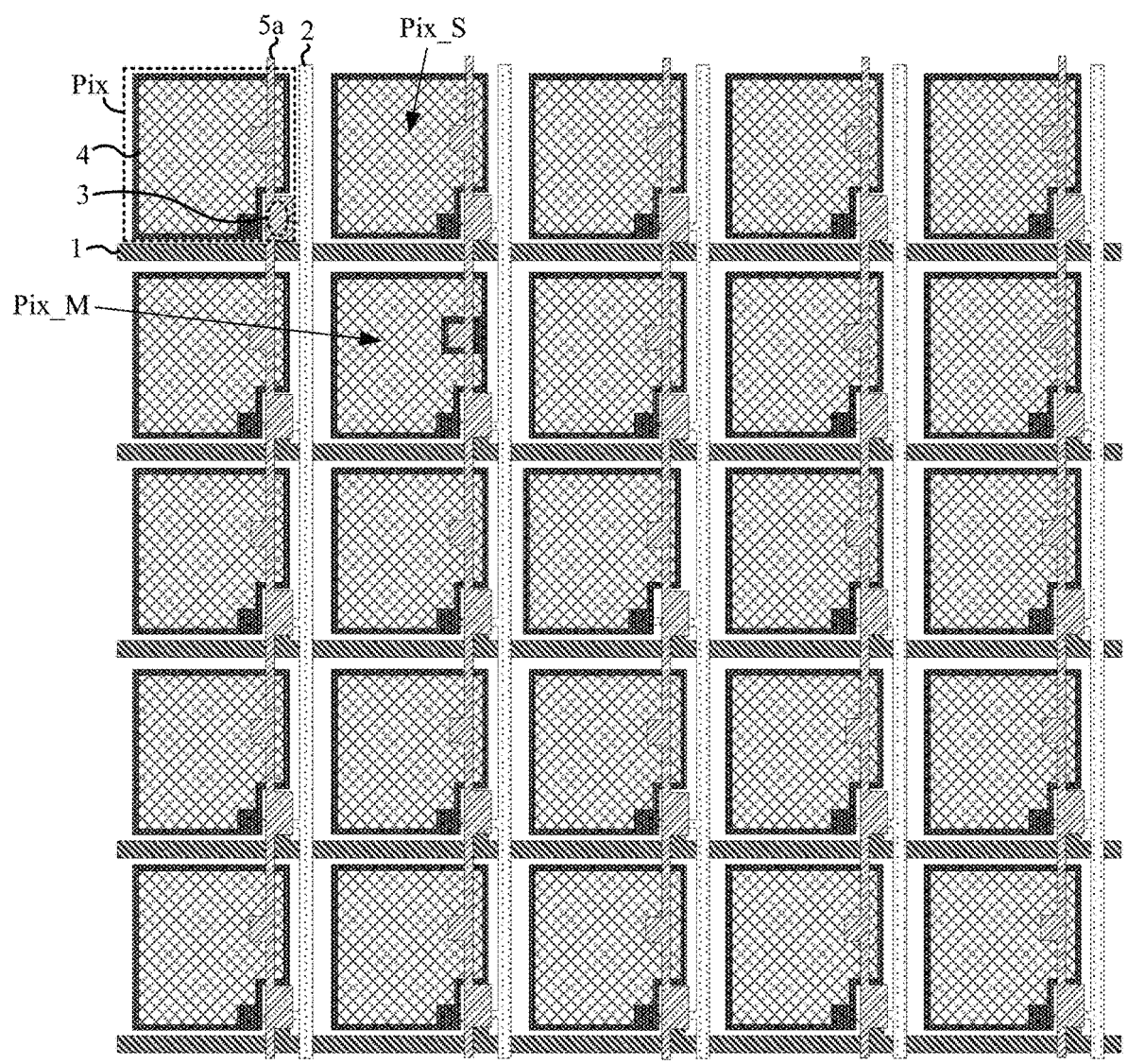
FIG. 1 is a schematic top view of a detection panel with marking pixels in the related art.
Figure 2:
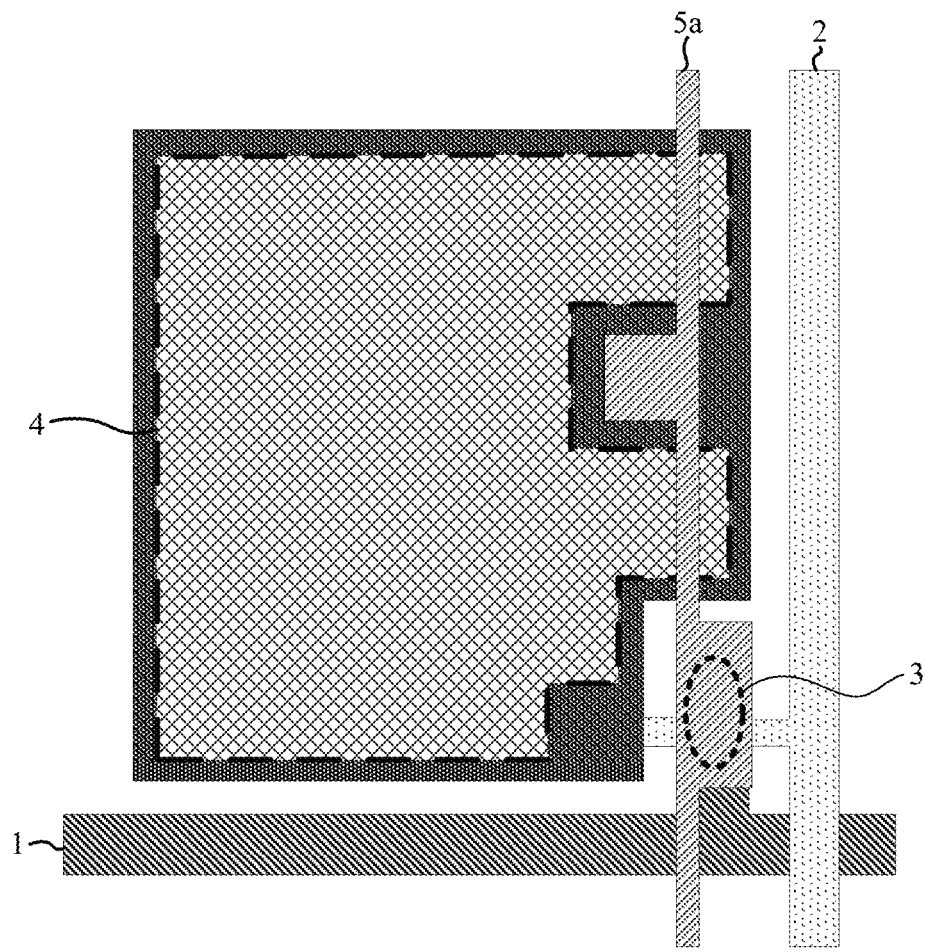
FIG. 2 is a schematic top view of a marking pixel in the related art.

In the development of flat panel detectors, in order to implement an image tracking function, customers propose to prepare marking pixels to be easily recognized at specific positions of a detection panel. FIG. 1 is a schematic top view of a detection panel with a marking pixel Pix_M in the related art, and FIG. 2 is a schematic top view of a marking pixel Pix_M in the related art, and as shown in FIG. 1 and FIG. 2, in the related art, in order to provide a bias voltage signal to each pixel Pix, a plurality of bias voltage lines 5a are generally provided, each bias voltage line 5a corresponds to one column of pixels Pix, and the bias voltage line 5a is electrically coupled to top electrodes of optical sensors 4 in the corresponding column of pixels Pix. When the marking pixel Pix_M is present in the column of pixels Pix corresponding to the bias voltage line 5a, the bias voltage line 5a is also electrically coupled to a source of a thin film transistor 3 in the marking pixel Pix_M.

In a detection process, the bias voltage line 5a loads a bias voltage signal to the source of the thin film transistor 3 in the marking pixel Pix_M, and when the thin film transistor 3 in the marking pixel Pix_M is turned on, the bias voltage signal is written into a signal detection line 2 corresponding thereto through the thin film transistor 3 for being read by an external processing chip. In a post imaging process, a gray scale value corresponding to the marking pixel Pix_M is maintained in a fully saturated state (taking 16 bits as an example, the gray scale value corresponding to the fully saturated state is $2^{16}-1=65535$).

However, in practical applications, it is found that when the thin film transistor 3 in the marking pixel Pix_M is turned on, the bias voltage line 5a, the source of the thin film transistor 3 and the signal detection line 2 coupled to a drain of the thin film transistor 3 are electrically coupled, i.e., a current is allowed therebetween, and the bias voltage line 5a charges the signal detection line 2 so that the bias voltage signal is loaded to the signal detection line 2. In the charging process, a voltage and a current of electrical signal loaded on the signal detection line 2 change rapidly and generate crosstalk to other signal detection lines 2 adjacent thereto, the crosstalk specifically includes mutual capacitance crosstalk (induced noise voltage generated by the other signal detection lines 2 adjacent thereto due to electric field coupling) and mutual inductance crosstalk (induced noise current generated by the other signal detection lines 2 adjacent thereto due to the action of a magnetic field); the severity of the crosstalk is positively correlated to an magnitude of voltage of the bias voltage signal provided by the bias voltage line 5a, i.e., the larger the magnitude of voltage of the bias voltage signal is, the larger the crosstalk of the signal detection line 2 electrically coupled to the bias voltage line 5a to the other signal detection lines 2 adjacent thereto during the charging process is.

In the related art, in order to ensure the normal operation of the optical sensor 4 in the detecting pixel Pix_S, the voltage (generally negative voltage) of the bias voltage signal provided by the bias voltage line 5a is relatively large in magnitude, generally ranges from −10V to −3V, so that the above-mentioned crosstalk problem is significant. In the post imaging process, gray scale values corresponding to one or more consecutive detecting pixels Pix_S adjacent to the marking pixel Pix_M in a row direction are relatively large.

In addition, after the bias voltage signal having a relatively large voltage is loaded to the signal detection line 2, when the pixels Pix in the next row are driven to perform detection, the detecting pixels Pix_S coupled to the signal detection line 2 generate detection electrical signals, the signal detection line 2 starts to discharge, and the voltage of the electrical signal loaded to the signal detection line 2 gradually decreases. However, since the voltage of the bias voltage signal is relatively large and a duration in which each row of pixels Pix are driven to perform detection is relatively short, before the voltage of the electrical signal loaded on the signal detection line 2 reaches the voltage corresponding to the detection electrical signal, thin film transistors 3 in the next row of pixels Pix are turned off, and the detection electrical signal is not accurately loaded on the signal detection line 2, so that the voltage of the electrical signal actually read by the external processing chip is relatively large. In the post imaging process, the gray scale values corresponding to the detecting pixels Pix_S located in one or more rows next to the marking pixel Pix_M and in the same column as the marking pixel Pix_M are relatively large.

Figure 3:
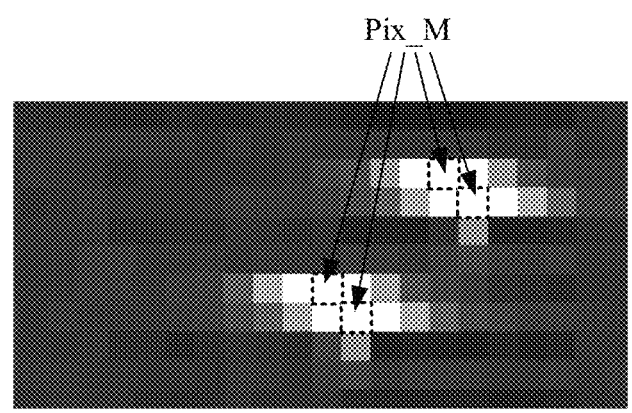
FIG. 3 is a diagram illustrating an image formed by a marking pixel and a detecting pixel at a periphery of the marking pixel in the related art.

FIG. 3 is a schematic diagram illustrating an image formed by a marking pixel Pix_M and a detecting pixels Pix_S at a periphery of the marking pixel Pix_M in the related art, as shown in FIG. 3, based on the above analysis and the schematic diagram of the image shown in FIG. 3, it can be seen that not only the position corresponding to the marking pixel Pix_M is in a fully saturated state (fully white), but also the position corresponding to the detecting pixel Pix_S at the periphery of the marking pixel Pix_M is in a fully saturated state or a relatively high gray scale state; that is, the detecting pixel Pix_S interferes with the gray scale value of the image formed at the position corresponding to the pixel Pix at the periphery of the detecting pixel Pix_S, thereby dead pixels may appear around the position corresponding to the detecting pixel Pix_S.

In order to overcome the technical problems in the related art, an embodiment of the present disclosure provides a corresponding solution.

Figure 4:
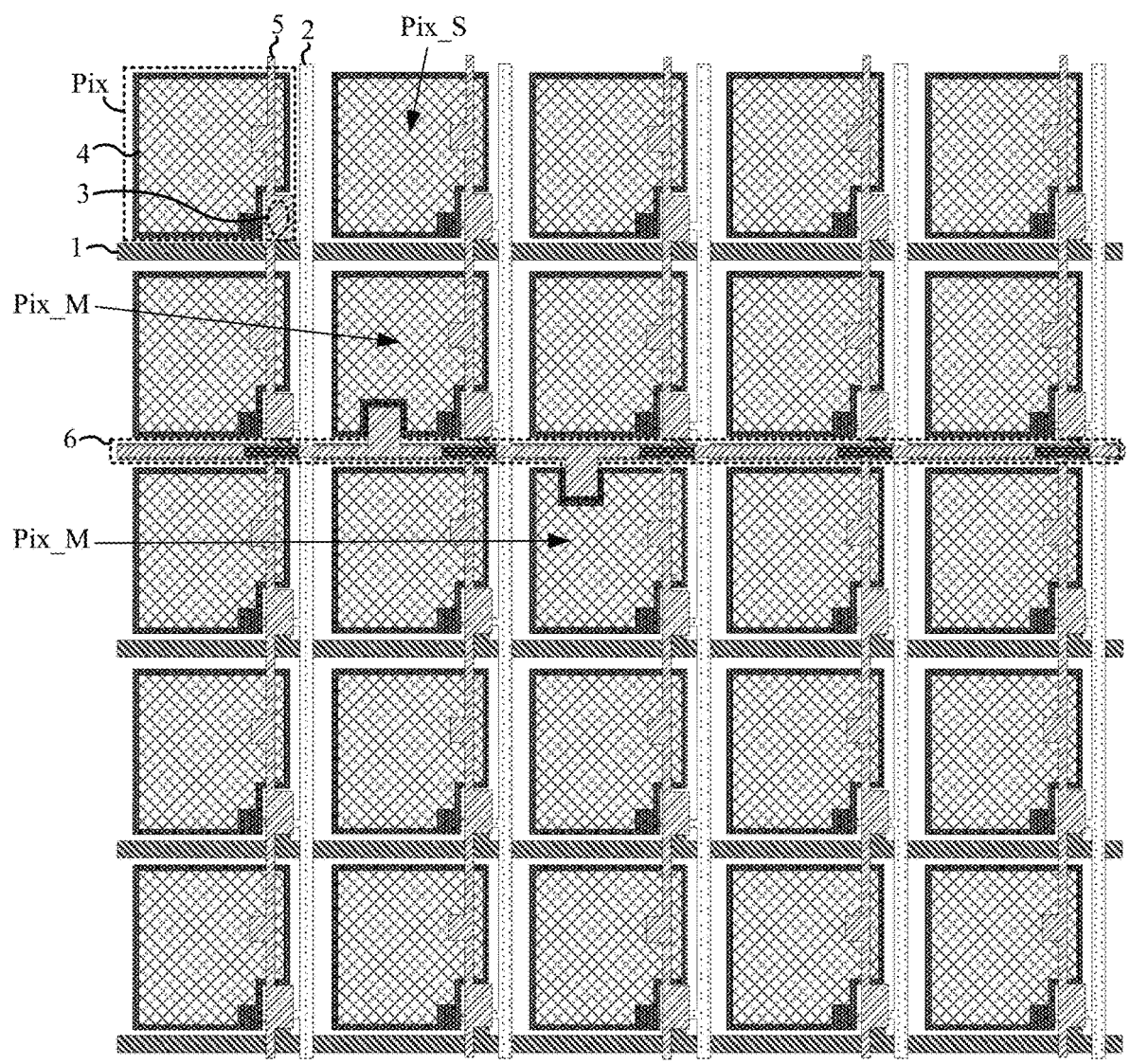
FIG. 4 is a schematic top view of a detection panel according to an embodiment of the present disclosure.
Figure 5:
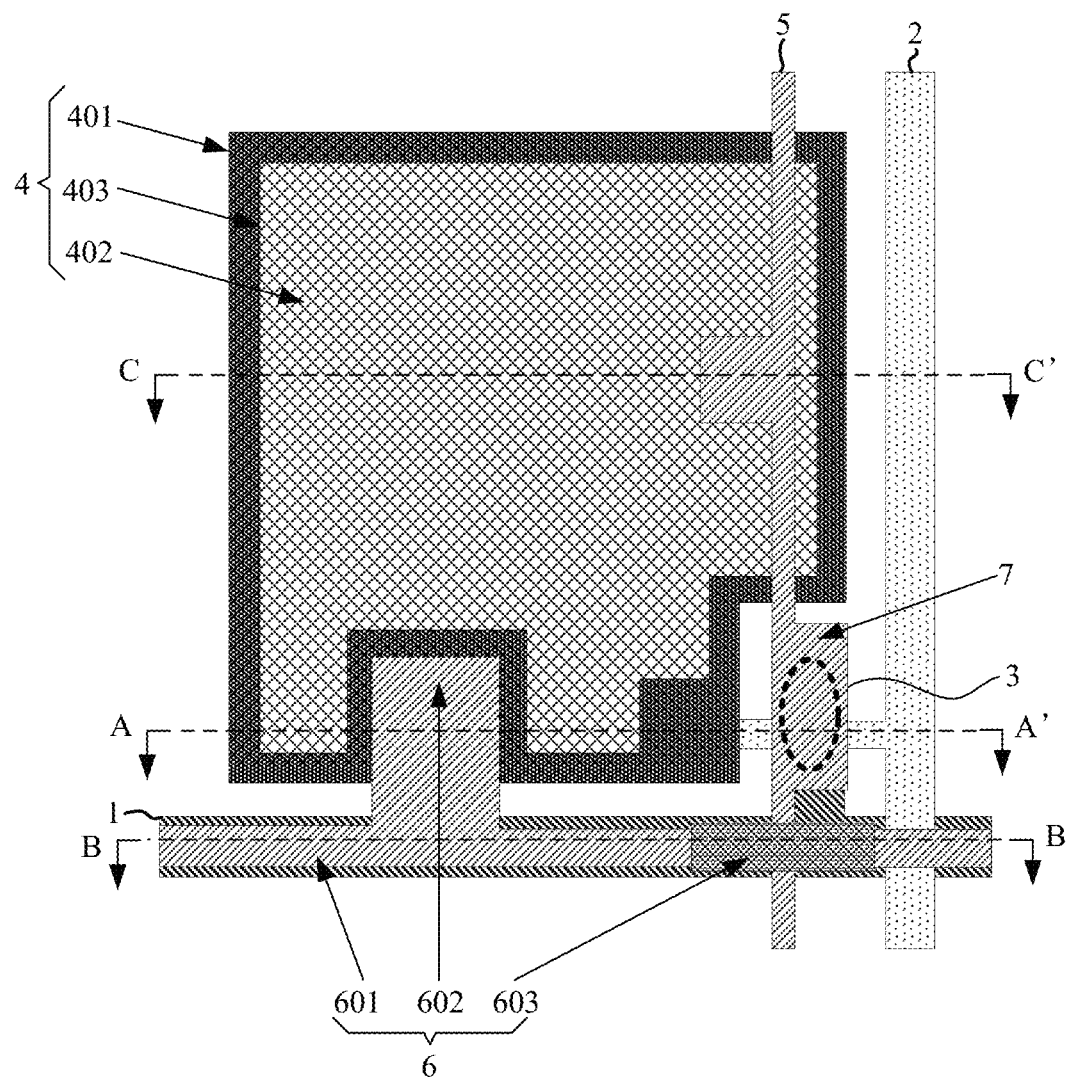
FIG. 5 is a schematic top view of a marking pixel according to an embodiment of the present disclosure.
Figure 6:
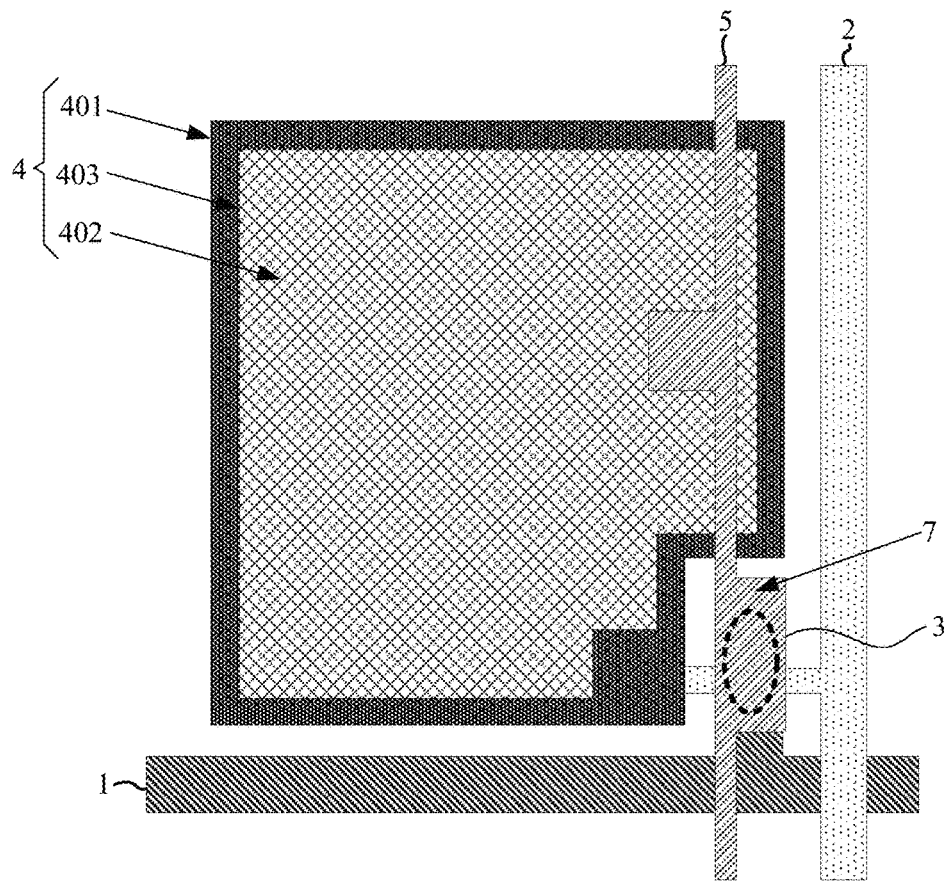
FIG. 6 is a schematic top view of a detecting pixel according to an embodiment of the present disclosure.
Figure 7A:
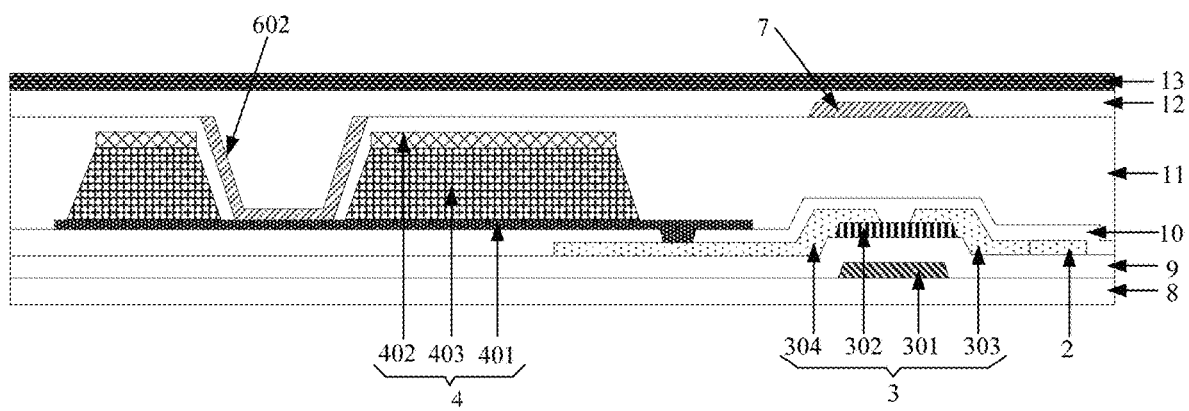
FIG. 7a is a schematic cross-sectional view taken along line A-A' of FIG. 5.
Figure 7B:
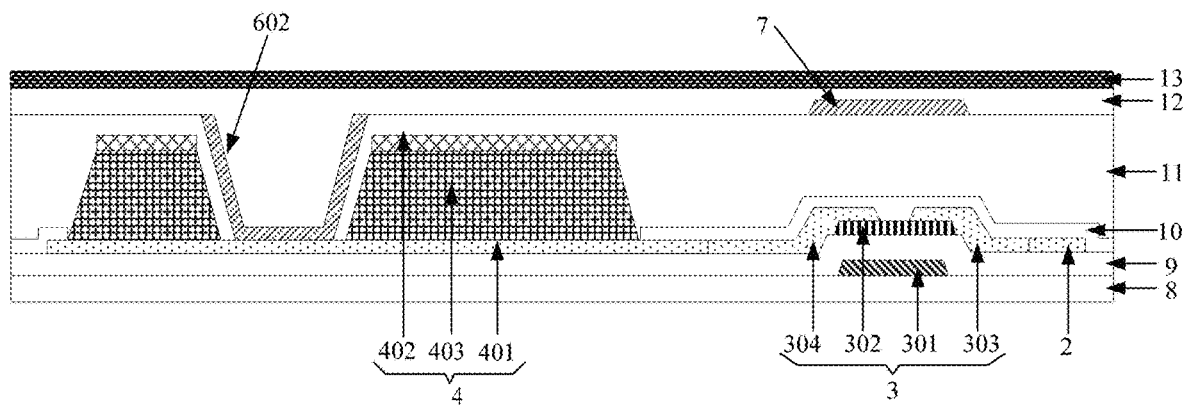
FIG. 7b is another schematic cross-sectional view taken along line A-A' of FIG. 5.
Figure 7C:
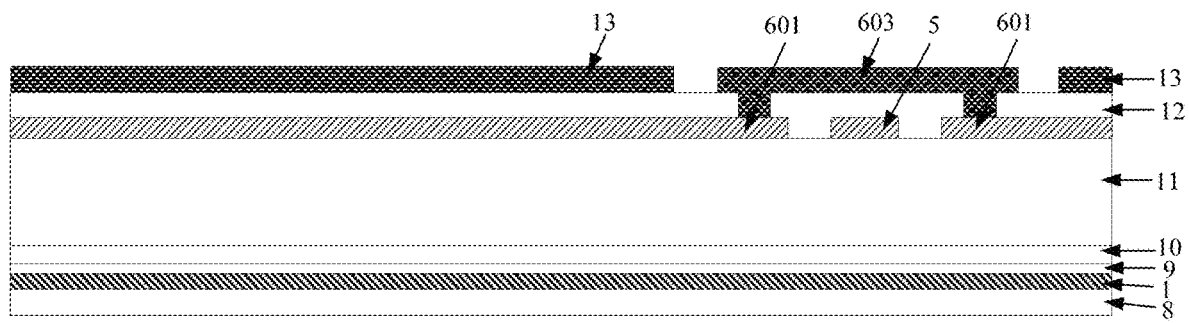
FIG. 7c is a schematic cross-sectional view taken along line B-B' of FIG. 5.
Figure 7D:
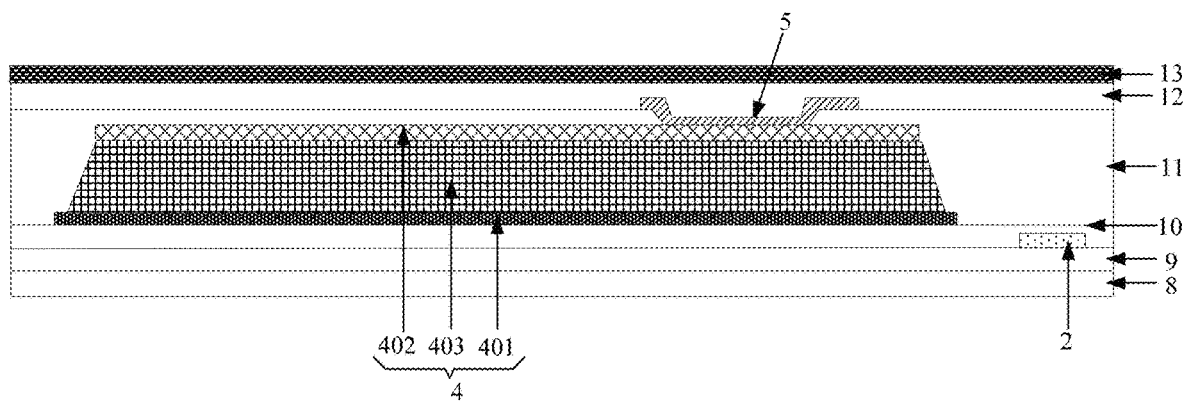
FIG. 7d is a schematic cross-sectional view taken along line C-C' of FIG. 5.

FIG. 4 is a schematic top view of a detection panel according to an embodiment of the present disclosure, FIG. 5 is a schematic top view of a marking pixel Pix according to an embodiment of the present disclosure, FIG. 6 is a schematic top view of a detecting pixel Pix according to an embodiment of the present disclosure, FIG. 7a is a schematic cross-sectional view taken along a line A-A' in FIG. 5, FIG. 7b is another schematic cross-sectional view taken along a line A-A' in FIG. 5, FIG. 7c is a schematic cross-sectional view taken along a line B-B' in FIG. 5, FIG. 7d is a schematic cross-sectional view taken along a line C-C' in FIG. 5, and as shown in FIG. 4 to FIG. 7d, the detection panel includes: a substrate 8, which is provided with a plurality of gate lines 1 and a plurality of signal detection lines 2 thereon, the plurality of gate lines 1 and the plurality of signal detection lines 2 define an array of the pixels Pix, and the array of the pixels Pix includes a plurality of pixels Pix, each of the pixels Pix is provided with a thin-film transistor 3 and an optical sensor 4 therein. The optical sensor 4 includes: a third electrode 401, a fourth electrode 402, and a photosensitive pattern 403 located between the third electrode 401 and the fourth electrode 402. A gate 301 of the thin film transistor 3 is electrically coupled to a corresponding one of the gate lines 1, a first electrode 303 of the thin film transistor 3 is electrically coupled to a corresponding one of the signal detection lines 2, and a second electrode 304 of the thin film transistor 3 is electrically coupled to the third electrode 401 of the optical sensor 4 located in the same pixel Pix.

The plurality of pixels Pix include at least one detecting pixel Pix_S and at least one marking pixel Pix_M, a first bias voltage line 5 and a second bias voltage line 6 are disposed on a side of the optical sensor 4 away from the substrate 8, the first bias voltage line 5 and the second bias voltage line 6 are intersected with and insulated from each other, the fourth electrode 402 of the optical sensor 4 in the detecting pixel Pix_S is electrically coupled to the first bias voltage line 5 corresponding thereto, and the second electrode 304 of the thin film transistor 3 in the marking pixel Pix_M is electrically coupled to the second bias voltage line 6 corresponding thereto.

In some implementations, the first bias voltage line 5 is configured to provide a first bias voltage signal to ensure that the optical sensor 4 in the detecting pixel Pix_S can operate normally; the second bias voltage line 6 is configured to provide a second bias voltage signal to provide a voltage, required to represent the highest gray scale value (fully saturated state) in the post imaging process, to the second electrode 304 of the thin film transistor 3 in the marking pixel Pix_M; where, since the first bias voltage signal and the second bias voltage signal are provided by different bias voltage lines, the first bias voltage signal and the second bias voltage signal may be different.

In some implementations, a magnitude of voltage of the second bias voltage signal is less than a magnitude of voltage of the first bias voltage signal. Illustratively, the voltage of the first bias voltage signal ranges from −10V to −3V, and the voltage of the second bias voltage signal ranges from −3V to +1V. Compared with the related art, the voltage applied to the second electrode 304 of the thin film transistor 3 in the marking pixel Pix_M is reduced, so that the crosstalk of the signal detection line 2 coupled with the marking pixel Pix_M to other signal detection lines 2 at a periphery of the signal detection line 2 coupled with the marking pixel Pix_M is reduced, the probability (related to the voltage of the second bias voltage signal) that the detecting pixel Pix_S located in one or more rows next to and in the same column as the marking pixel Pix_M normally outputs the detection electrical signal is greatly increased, and the interference of the marking pixel Pix_S to the gray scale value at a position corresponding to another pixel Pix at a periphery of the marking pixel Pix_S can be reduced or even eliminated.

In some implementations, the optical sensor 4 may be a PIN photodiode or a PN photodiode. The photosensitive pattern 403 includes a P-type semiconductor layer and an N-type semiconductor layer (e.g., an N-type Si layer) which are stacked, or includes a P-type semiconductor layer (e.g., a P-type Si layer), an intrinsic semiconductor layer (e.g., an intrinsic Si layer), and an N-type semiconductor layer (e.g., an N-type Si layer) which are stacked. For example, the I layer is made of an a-Si material, the P layer is made of a material of a-Si doped with Boron(B) ions, and the N layer is made of a material of a-Si doped with Phosphorus(P) ions. In some implementations, the fourth electrode 402 is a transparent electrode, and may be made of a transparent metal oxide such as Indium Tin Oxide (ITO), Indium Zinc Oxide (IZO), Gallium Zinc Oxide (GZO); the third electrode 401 is a metal electrode, and may be made of a metal material such as copper (Cu), aluminum (Al), or titanium (Ti) or an alloy material. The first electrode 303 and the second electrode 304 of the thin film transistor 3 refer to a drain and a source of the thin film transistor 3, respectively. In the pixel Pix, the structures that are stacked from bottom to top include: a gate 301, a gate insulating layer 9, an active layer pattern 302, the first/second electrodes 303/304, a passivation layer 10, the third electrode 401, the photosensitive pattern 403, the fourth electrode 402, a planarization layer 11, and the first bias voltage line 5.

In some implementations, the first bias voltage lines 5 and second bias voltage lines 6 which are different from each other are configured to respectively provide different bias voltage signals to the fourth electrode 402 of the optical sensor 4 in the detecting pixel Pix_S and the second electrode 304 of the thin film transistor 3 in the marking pixel Pix_M, so that the interference of the marking pixel Pix_M on the gray scale value at the position corresponding to another pixels Pix at a periphery of the marking pixel Pix_M can be reduced or even eliminated, and the accuracy of detection is improved.

It should be noted that, in some implementations, the first bias voltage line 5 may also be coupled to the fourth electrode 402 of the optical sensor 4 in the marking pixel Pix_M, and in such case, although the optical sensor 4 in the marking pixel Pix_M may also output a detection electrical signal corresponding to an illumination intensity due to a photoelectric effect during the detection process, since the voltage of the second bias voltage signal is much larger than the voltage of the detection electrical signal output by the optical sensor 4, the voltage at the second electrode 304 of the thin film transistor 3 in the marking pixel Pix_M is maintained at the voltage of the second bias voltage signal. In addition, when the first bias voltage line 5 is electrically coupled to the fourth electrode 402 of the optical sensor 4 in the marking pixel Pix_M, in a case where the first bias voltage line 5 provides the bias voltage signal and the second bias voltage line 6 does not provide the bias voltage signal, the marking pixel Pix_M can serve as the detecting pixel.

Referring to FIG. 7a, FIG. 7a shows a case where the second electrode 304 of the thin film transistor 3 and the third electrode 401 of the optical sensor 4 are arranged in different layers, and are coupled by a via hole. Referring to FIG. 7b, FIG. 7b shows a case where the second electrode 304 of the thin film transistor 3 and the third electrode 401 of the optical sensor 4 are arranged in a same layer, and are directly coupled with each other.

In some implementations, a direction in which the first bias voltage line 5 extends is parallel to a direction in which the signal detection line 2 extends; a direction in which the second bias voltage line 6 extends is parallel to a direction in which the gate line 1 extends. Taking the case shown in the drawing as an example, the direction in which the gate line 1 extends is a horizontal direction, and the direction in which the signal detection line 2 extends is a vertical direction.

With continued reference to FIG. 5, in some implementations, the second bias voltage line 6 includes: a plurality of first conductive portions 601 arranged at intervals along a first direction, a conductive bridge line 603 connecting adjacent ones of the first conductive portions 601, and at least one second conductive portion 602; the first conductive portions 601 and the second conductive portion 602 are disposed in the same layer as the first bias voltage line 5, the conductive bridge line 603 is located on a side of the first bias voltage line 5 away from the substrate 8 and insulated from the first bias voltage line 5, an end of the second conductive portion 602 is directly connected to the first conductive portion 601, and another end of the second conductive portion 602 extends into the marking pixel Pix_M corresponding thereto and is electrically coupled to the second electrode 304 of the thin film transistor 3 in the marking pixel Pix_M.

In some implementations, an insulating protective layer 12 is formed on a side of the first bias voltage line 5 away from the substrate 8, and a transparent shielding electrode pattern 13 is disposed on the insulating protective layer 12; the conductive bridge line 603 and the transparent shielding electrode pattern 13 are disposed in a same layer and insulated from each other. The transparent shielding electrode pattern 13 is generally grounded, and is used for shielding an external electric field from affecting the detection panel.

In some implementations, the first conductive portions 601 and the second conductive portion 602 may be simultaneously manufactured based on a same patterning process in the process of manufacturing the first bias voltage line 5, and the transparent shielding electrode pattern 13 and the conductive bridge line 603 may be simultaneously manufactured based on a same patterning process in the process of manufacturing the transparent shielding electrode pattern 13; in view of above, the second bias voltage line 6 in the embodiment of the present disclosure may be manufactured based on the process for manufacturing the first bias voltage line 5 and the process for manufacturing the transparent shielding electrode pattern 13, and no additional manufacturing process is required, which is beneficial to reduce the manufacturing cost and shortening the manufacturing period.

In some implementations, the another end of the second conductive portion 602 extends into the marking pixel Pix_M corresponding thereto and is coupled to the third electrode 401 of the optical sensor 4 in the marking pixel Pix_M through a via hole, so that the second bias voltage line 6 is coupled to the second electrode 304 of the thin film transistor 3 in the marking pixel Pix_M corresponding thereto.

In some implementations, an orthographic projection of the first conductive portion 601 on the substrate 8 is located in a region where an orthographic projection of the gate line 1 on the substrate 8 is located, that is, the first conductive portion 601 does not block the light emitted to the optical sensor 4, so as to ensure an aperture ratio of the pixel Pix.

It should be noted that, the case where the second bias voltage line 6 includes the first conductive portions 601, the conductive bridge line 603 and the second conductive portion 602 is merely exemplary, but does not limit the technical solution of the present disclosure.

In some implementations, the detection panel further includes: a light-shielding pattern 7 located on a side of the thin film transistor 3 away from the substrate 8, an orthographic projection of the light-shielding pattern 7 on the substrate 8 completely covers an orthographic projection of the active layer pattern 302 in the thin film transistor 3 on the substrate 8, and the light-shielding pattern 7 and the first bias voltage line 5 are arranged in a same layer. In the implementations, with the light-shielding pattern 7, a problem that light irradiates a channel region of the thin film transistor 3 to cause deviation of electrical characteristics of the thin film transistor 3 can be avoided.

Figure 8:
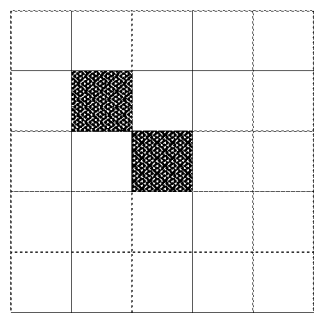
FIG. 8 is a schematic diagram illustrating different arrangements of marking pixels and detecting pixels according to an embodiment of the present disclosure.
Figure 8:
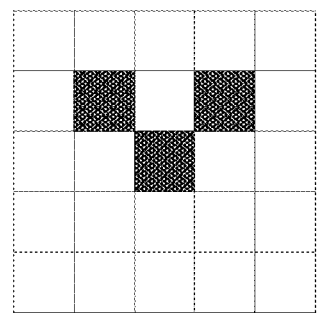
Figure 8:
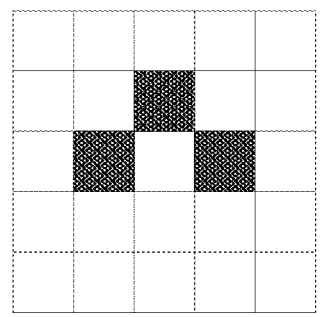
Figure 8:
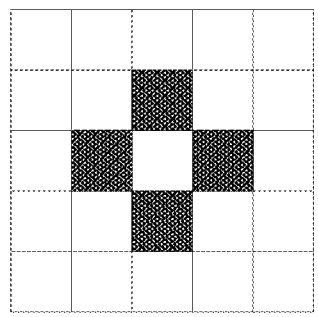
Figure 8:
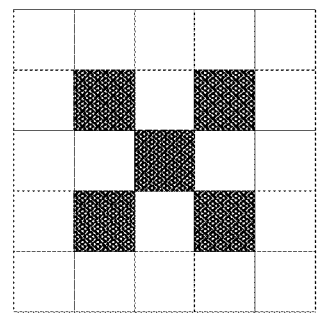

FIG. 8 is a schematic diagram illustrating different arrangements of marking pixels and detecting pixels according to an embodiment of the present disclosure, as shown in FIG. 8, the detection panel includes at least one marking region, and the marking region is provided with at least two marking pixels Pix_M therein; in the same marking region, for any one of the marking pixels Pix_M, there is at least one another marking pixel Pix_M adjacent thereto in both the row direction and the column direction, and there is no marking pixel Pix_M located in the same row as the marking pixels Pix_M and adjacent thereto in the column direction, and there is no marking pixel Pix_M located in the same column as the marking pixel Pix_M and adjacent thereto in the row direction.

Portions (a) to (e) of FIG. 8 respectively show five different marking regions, each of which includes total 25 pixels Pix of 5×5; where the marking region shown in the portion (a) includes two marking pixels Pix_M and twenty-three detecting pixels Pix_S, and is provide with one second bias voltage line 6; the marking regions shown in the portions (b) and (c) each include three marking pixels Pix_M and twenty-two detecting pixels Pix_S, and are provided with one second bias voltage line 6; the marking region shown in the portion (d) includes four marking pixels Pix_M and twenty-one detecting pixels Pix_S, and is provided with two second bias voltage lines 6; the marking region shown in the portion (e) includes five marking pixels Pix_M and twenty detecting pixels Pix_S, and is provided with two second bias voltage lines 6.

Specifically, in the case shown in the portion (a), the marking pixels Pix_M in the same marking region are arranged in an oblique line, a direction in which the oblique line extends intersects with both the row direction and the column direction; in the case shown in the portion (b), the marking pixels Pix_M in the same marking region are arranged in a V-shape; in the case shown in portion (c), the marking pixels Pix_M in the same marking region are arranged in an inverted V shape; in the case shown in the portion (d), the marking pixels Pix_M in the same marking region are arranged in a diamond shape; in the case shown in the portion (e), the marking pixels Pix_M in the same marking region are arranged in an X-shape.

It should be noted that the different cases of marking pixels Pix_M in the marking regions shown in FIG. 8 are only for illustrative purposes, and does not limit the technical solution of the present disclosure. In practical applications, the marking region is generally provided in a peripheral region of the detection panel (a region proximal to an edge of the detection panel), and an entire middle region of the detection panel is available for detection.

Figure 9:
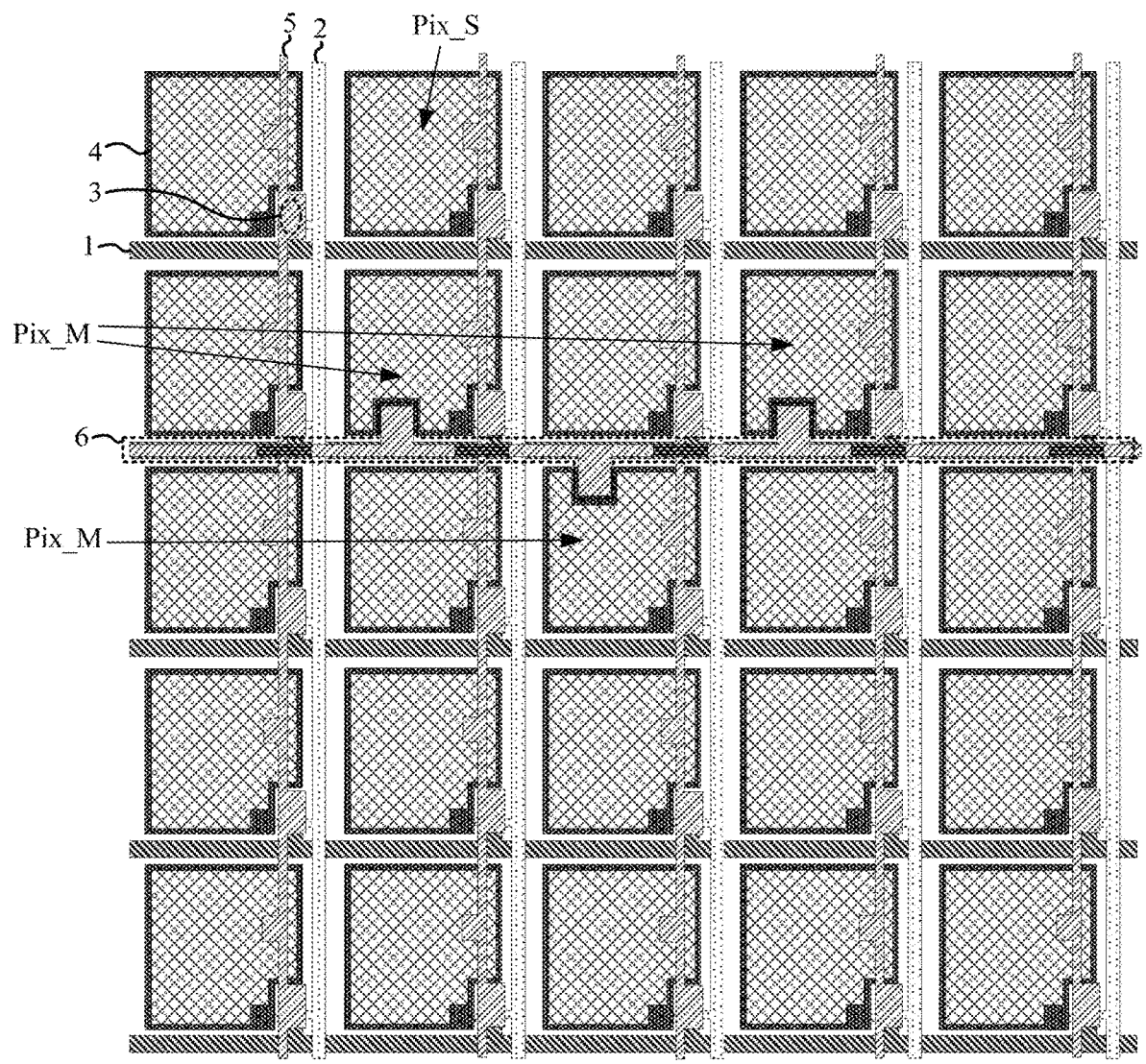
FIG. 9 is a schematic top view of the portion (b) in FIG. 8.
Figure 10:
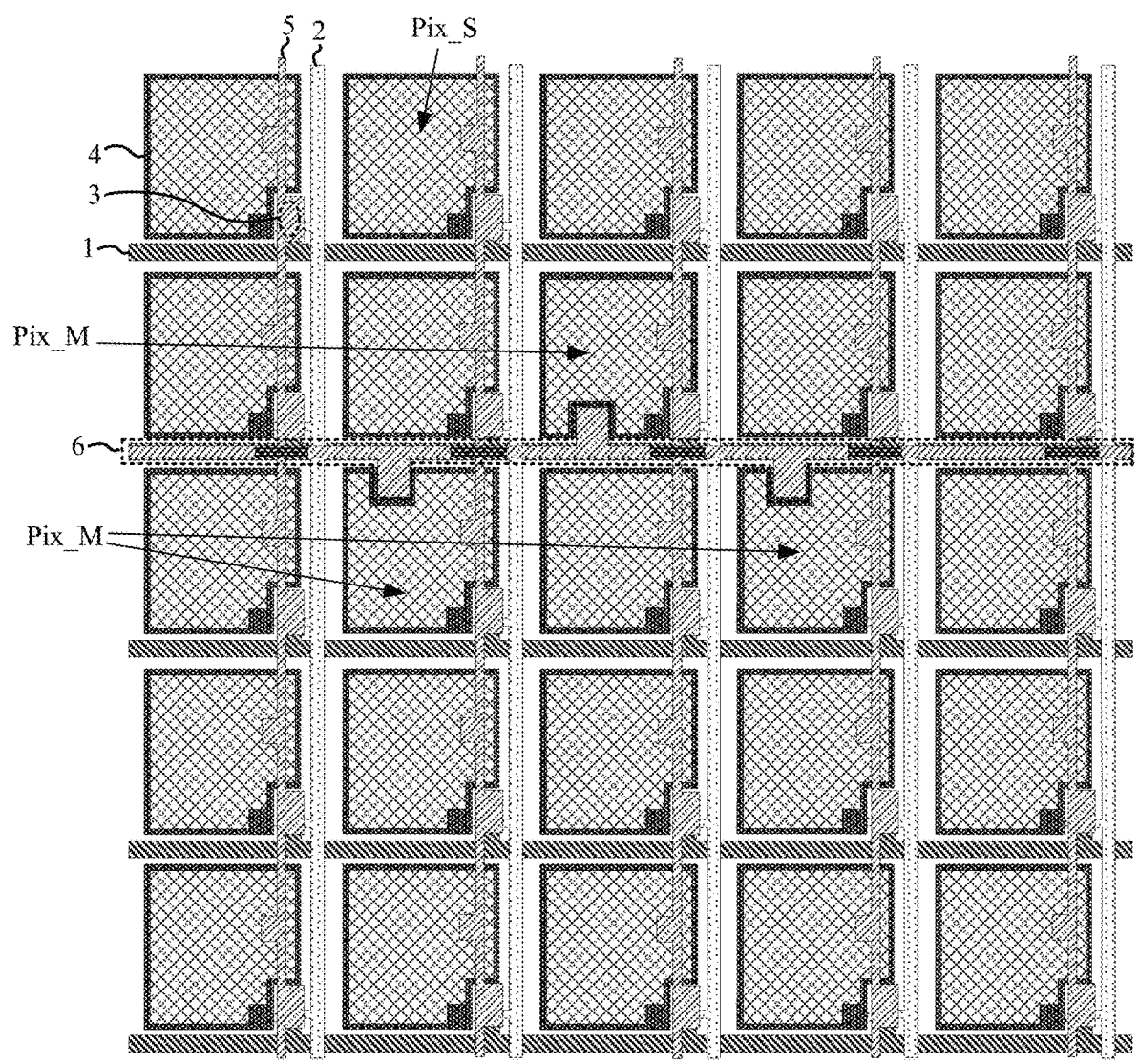
FIG. 10 is a schematic top view of the portion (c) in FIG. 8.
Figure 11:
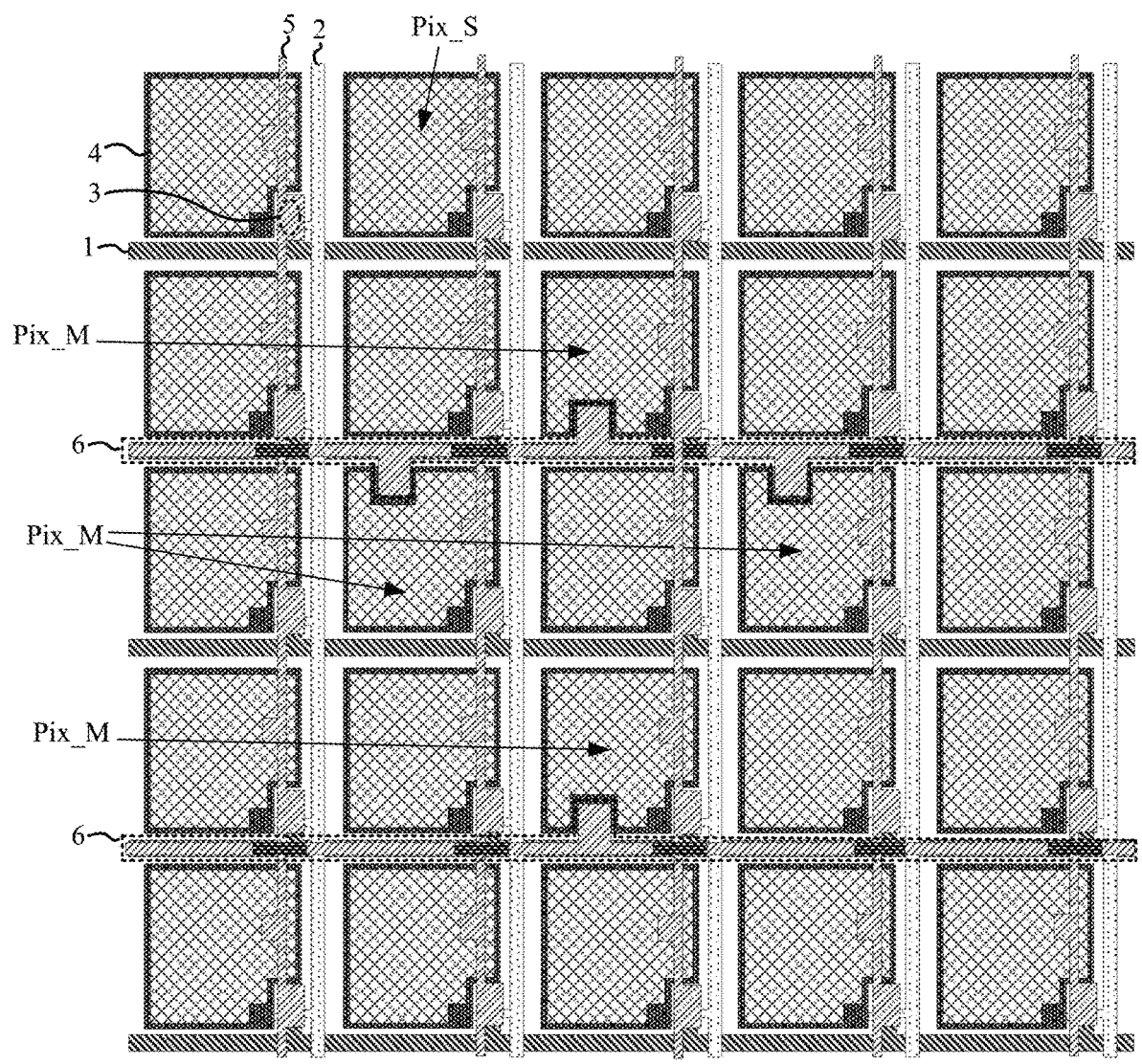
FIG. 11 is a schematic top view of the portion (d) of FIG. 8.
Figure 12:
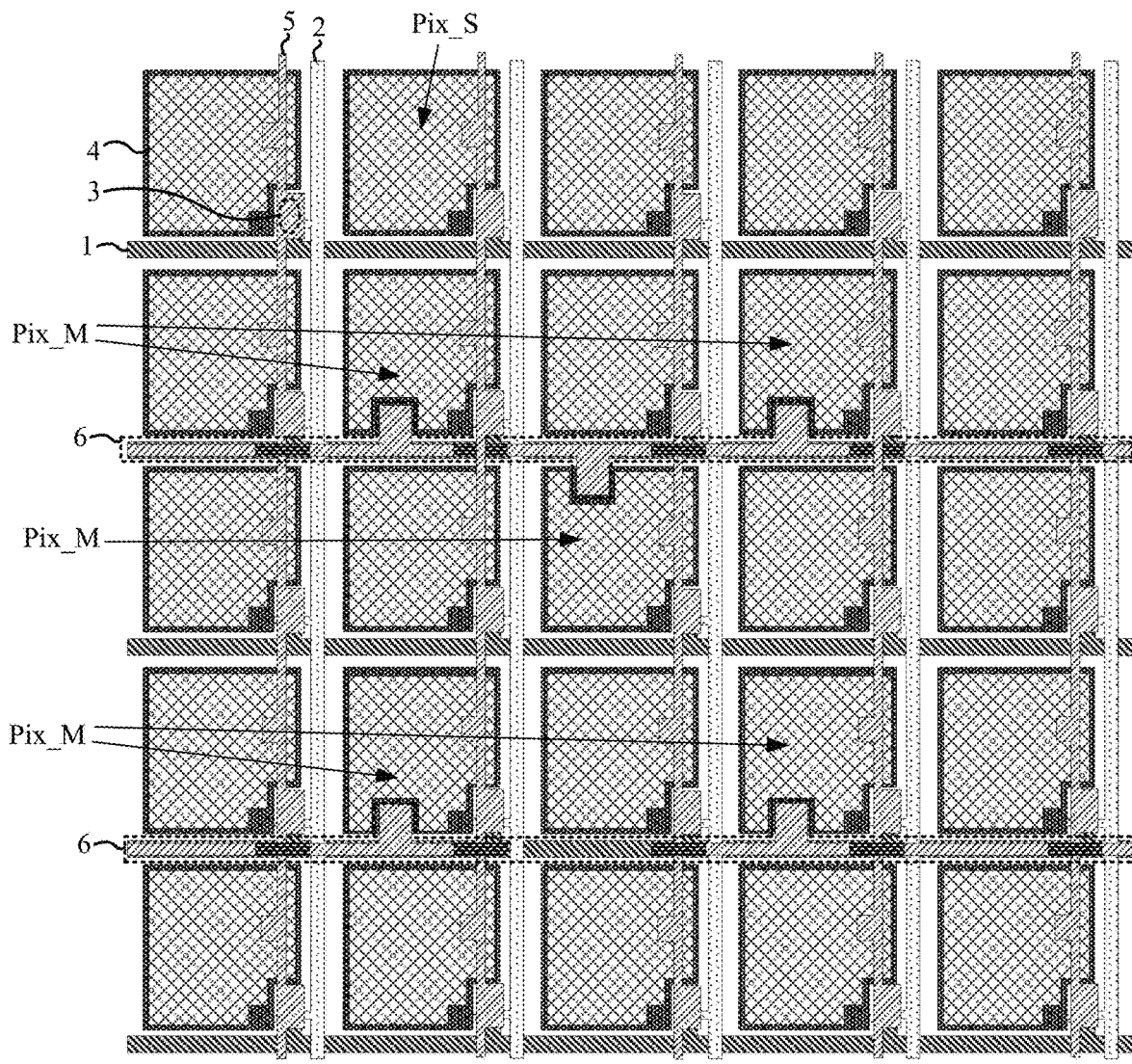
FIG. 12 is a schematic top view of the portion (e) in FIG. 8.

FIG. 4 is a schematic top view of the portion (a) in FIG. 8. FIG. 9 is a schematic top view of the portion (b) in FIG. 8, FIG. 10 is a schematic top view of the portion (c) in FIG. 8, FIG. 11 is a schematic top view of the portion (d) in FIG. 8, and FIG. 12 is a schematic top view of the portion (e) in FIG. 8. As shown in FIG. 4 and FIGS. 9 to 12, in some implementations, in the array of pixels Pix, a row of pixels Pix including the marking pixel Pix_M is a specific row of pixels Pix, and all marking pixels Pix_M in the same specific row of pixels Pix correspond to the same second bias voltage line 6.

In some implementations, in the array of pixels, there are two adjacent specific rows of pixels Pix in which all marking pixels Pix_M correspond to the same second bias voltage line 6. The number of second bias voltage lines 6 in the detection panel can be reduced by sharing the same second bias voltage line 6 by adjacent specific rows of pixels.

The embodiment of the present disclosure provides the detection panel, by means of respectively providing, by the first bias voltage line and second bias voltage line which are different from each other, different bias voltage signals to the fourth electrode 402 of the optical sensor 4 in the detecting pixel Pix_S and the second electrode 304 of the thin film transistor 3 in the marking pixel Pix_M, the interference of the marking pixel Pix_M on the gray scale value at the position corresponding to another pixel Pix at the periphery of the marking pixel Pix_M can be reduced or even eliminated.

Based on the same inventive concept, an embodiment of the present disclosure further provides a flat panel detector, which includes a detection panel, where the detection panel may adopt the detection panel provided in the foregoing embodiment, and for the description of the detection panel, reference may be made to the contents in the foregoing embodiment, and details are not repeated here.

In some implementations, the flat panel detector may particularly be an X-ray flat panel detector.

Based on the same inventive concept, an embodiment of the present disclosure further provide a method for manufacturing a detection panel, which is used for manufacturing the detection panel provided in the foregoing embodiments, and will be described in detail below with reference to the accompanying drawings.

Figure 13:
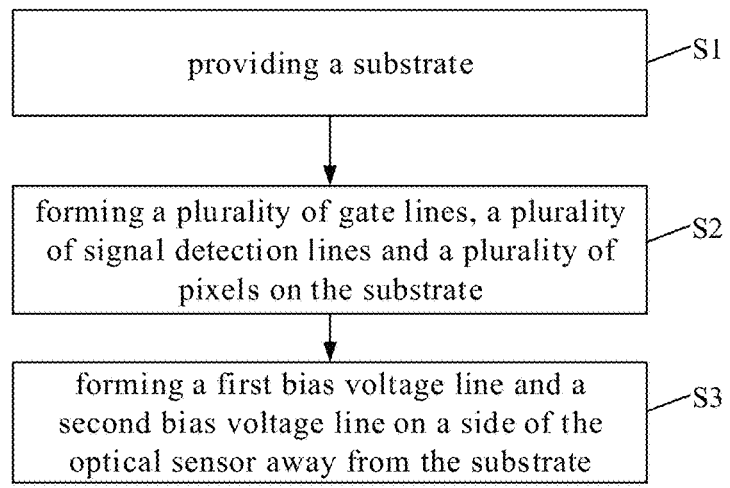
FIG. 13 is a flowchart of a method for manufacturing a detection panel according to an embodiment of the present disclosure.

FIG. 13 is a flowchart of a method for manufacturing a detection panel according to an embodiment of the present disclosure, as shown in FIG. 13, the method includes the following steps S1 to S3.

Step S1, providing a substrate.

The substrate may be a glass substrate or a flexible substrate.

Step S2, forming a plurality of gate lines, a plurality of signal detection lines and a plurality of pixels on the substrate.

A thin film transistor and an optical sensor are provided in each pixel, the optical sensor includes: a third electrode, a fourth electrode and a photosensitive pattern located between the third electrode and the fourth electrode, a gate of the thin film transistor is electrically coupled with a corresponding one of the gate lines, a first electrode of the thin film transistor is electrically coupled with a corresponding one of the signal detection lines, a second electrode of the thin film transistor is electrically coupled with the third electrode of the optical sensor located in the same pixel, and the plurality of pixels include at least one detecting pixel and at least one marking pixel.

The process of forming the plurality of gate lines, the plurality of signal detection lines, and the plurality of pixels includes: sequentially forming a gate metal layer (including the gate lines and gates of thin film transistors), a gate insulating layer, active layer patterns of the thin film transistors, a source-drain metal layer (including signal detection lines, first electrodes of the thin film transistors and second electrodes of the thin film transistors), a passivation layer, the third electrode of the optical sensor (the third electrode of the optical sensor being coupled with the second electrode of the thin film transistor through a via hole in the passivation layer), a photosensitive pattern and the fourth electrode on the substrate.

Step S3, forming a first bias voltage line and a second bias voltage line on a side of the optical sensor away from the substrate.

The first bias voltage line and the second bias voltage line are arranged to intersect with and insulated from each other, the fourth electrode of the optical sensor in the detecting pixel is electrically coupled to the first bias voltage line corresponding thereto, and the second electrode of the thin film transistor in the marking pixel is electrically coupled to the second bias voltage line corresponding thereto.

Figure 14:
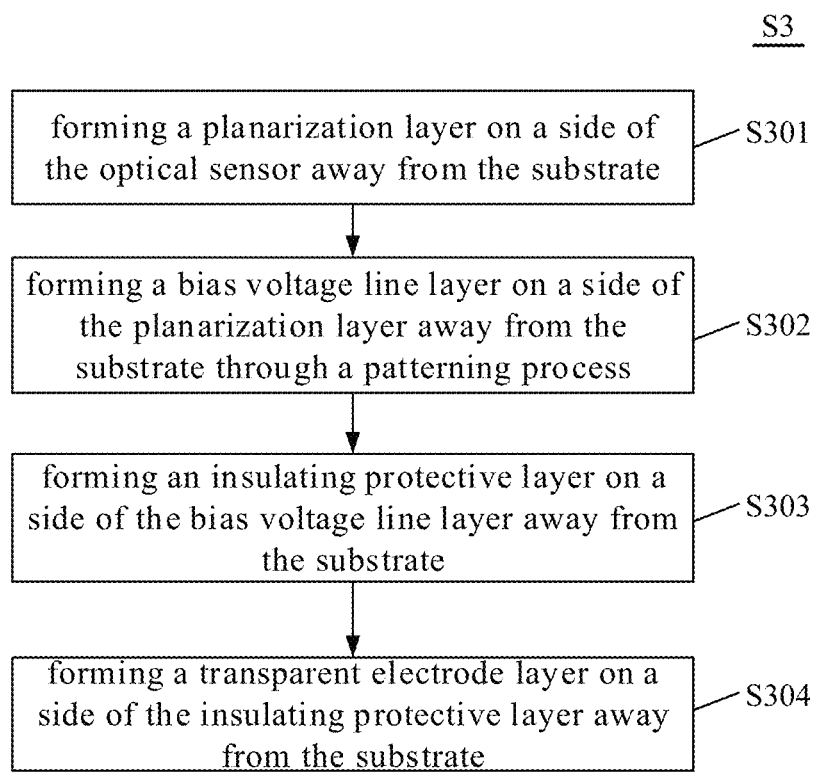
FIG. 14 is a flowchart illustrating an alternative implementation of step S3 according to an embodiment of the present disclosure.

FIG. 14 is a flowchart of an alternative implementation of step S3 according to an embodiment of the present disclosure, and as shown in FIG. 14, the step S3 includes steps S301 to S304.

Step S301, forming a planarization layer on a side of the optical sensor away from the substrate.

The planarization layer is provided with a first via hole communicating with the fourth electrode of the optical sensor in the detecting pixel and a second via hole communicating with the third electrode of the optical sensor in the marking pixel.

Step S302, forming a bias voltage line layer on a side of the planarization layer away from the substrate through a patterning process.

The bias voltage line layer includes: a first bias voltage line, first conductive portions and a second conductive potion, the first bias voltage line is coupled with the fourth electrode of the optical sensor corresponding thereto through the first via hole, and the second conductive portion is coupled with the third electrode of the optical sensor corresponding thereto through the second via hole.

Step S303, forming an insulating protective layer on a side of the bias voltage line layer away from the substrate, where third via holes communicating with the first conductive portions are formed in the insulating protective layer.

Step S304, forming a transparent electrode layer on a side of the insulating protective layer away from the substrate.

The transparent electrode layer includes: a conductive bridge line and a transparent shielding electrode pattern, the conductive bridge line is coupled with two adjacent ones of the first conductive portions corresponding thereto through the third via holes so as to realize an electrical connection between the adjacent ones fo the first conductive portions; the conductive bridge line is insulated from the transparent shielding electrode pattern.

It should be noted that the above-mentioned case of manufacturing the first bias voltage line and the second bias voltage line by using steps S301 to S304 is only illustratively, and does not limit the technical solution of the present disclosure.

It will be understood that the above embodiments are merely exemplary embodiments adopted to illustrate the principles of the present disclosure, and the present disclosure is not limited thereto. It will be apparent to those skilled in the art that various modifications and changes can be made without departing from the spirit and scope of the present disclosure, and such modifications and changes are also considered to be within the scope of the present disclosure.

The invention claimed is:

1. A detection panel, comprising:
   a substrate;
   a plurality of gate lines extending in a first direction on the substrate;
   a plurality of signal detection lines extending in a second direction on the substrate, the second direction being different from the first direction;
   an array of pixels defined by the plurality of gate lines and the plurality of signal detection lines and located on the substrate, wherein the array of pixels includes a plurality of pixels each having a thin film transistor and an optical sensor disposed therein, the optical sensor comprises a third electrode, a fourth electrode and a photosensitive pattern located between the third electrode and the fourth electrode, a gate of the thin film transistor is electrically coupled to one of the gate lines corresponding thereto, a first electrode of the thin film transistor is electrically coupled to one of the signal detection lines corresponding thereto, and a second electrode of the thin film transistor is electrically coupled to the third electrode of the optical sensor located in the same pixel; and the plurality of pixels include at least one detecting pixel and at least one marking pixel; and
   a first bias voltage line and a second bias voltage line located on a side of the optical sensor away from the substrate, the first bias voltage line and the second bias voltage line are intersected with and insulated from each other, wherein
   the fourth electrode of the optical sensor in the detecting pixel is electrically coupled to the first bias voltage line corresponding thereto, and the second electrode of the thin film transistor in the marking pixel is electrically coupled to the second bias voltage line corresponding thereto.

2. The detection panel according to claim 1, wherein a direction in which the first bias voltage line extends is parallel to a direction in which the signal detection line extends;
a direction in which the second bias voltage line extends is parallel to a direction in which the gate line extends.

3. The detection panel according to claim 2, wherein the second bias voltage line comprises a plurality of first conductive portions arranged at intervals along the first direction, a conductive bridge line connecting adjacent ones of the first conductive portions and at least one second conductive portion;
the first conductive portions and the second conductive portion are arranged in the same layer as the first bias voltage line, the conductive bridge line is located on a side of the first bias voltage line away from the substrate and insulated from the first bias voltage line, an end of the second conductive portion is directly coupled with the first conductive portion, and another end of the second conductive portion extends into the marking pixel corresponding thereto and is electrically coupled with the second electrode of the thin film transistor in the marking pixel.

4. The detection panel according to claim 3, further comprising an insulating protective layer located on a side of the first bias voltage line away from the substrate, and a transparent shielding electrode pattern located on the insulating protective layer, wherein
the conductive bridge line and the transparent shielding electrode pattern are arranged in a same layer and are insulated from each other.

5. A flat panel detector, comprising the detection panel according to claim 4.

6. The detection panel according to claim 3, wherein the another end of the second conductive portion extends into the marking pixel corresponding thereto and is coupled to the third electrode of the optical sensor in the marking pixel through a via hole.

7. The detection panel according to claim 3, wherein an orthographic projection of the first conductive portion on the substrate is located within a region where an orthographic projection of the gate line on the substrate is located.

8. A flat panel detector, comprising the detection panel according to claim 3.

9. The detection panel according to claim 2, wherein, in the array of pixels, a row of pixels comprising the marking pixel is a specific row of pixels, and all marking pixels located in the same specific row of pixels correspond to the same second bias voltage line.

10. The detection panel according to claim 9, wherein in the array of pixels, there are two adjacent specific rows of pixels in which all the marking pixels correspond to the same second bias voltage line.

11. A flat panel detector, comprising the detection panel according to claim 2.

12. The detection panel according to claim 1, wherein the detection panel comprises at least one marking region in which at least two marking pixels are disposed;
in the same marking region, for any marking pixel, there is at least one another marking pixel adjacent thereto both in a row direction and a column direction, there is no marking pixel located in the same row as the marking pixel and adjacent to the marking pixel in the column direction, and there is no marking pixel located in the same column as the marking pixel and adjacent to the marking pixel in the row direction.

13. The detection panel according to claim 12, wherein in the same marking region, the marking pixels are arranged in an oblique line, a direction in which the oblique line extends intersects with both the row direction and the column direction;
or, in the same marking region, the marking pixels are arranged in a V shape;
or, in the same marking region, the marking pixels are arranged in an inverted V shape;
or, in the same marking region, the marking pixels are arranged in a diamond shape;
or, in the same marking region, the marking pixels are arranged in an X shape.

14. The detection panel according to claim 1, further comprising: a light-shielding pattern located on a side of the thin film transistor away from the substrate, an orthographic projection of the light-shielding pattern on the substrate completely covers an orthographic projection of an active layer pattern in the thin film transistor on the substrate, and the light-shielding pattern and the first bias voltage line are arranged in a same layer.

15. The detection panel according to claim 1, wherein the fourth electrode of the optical sensor in the marking pixel is further electrically coupled to the first bias voltage line.

16. The detection panel according to claim 1, wherein the first bias voltage line is configured to transmit a first bias voltage and the second bias voltage line is configured to transmit a second bias voltage, a magnitude of the first bias voltage is different from a magnitude of the second bias voltage.

17. A flat panel detector, comprising the detection panel according to claim 1.

18. A method for manufacturing the detection panel according to claim 1, comprising:
providing a substrate;
forming a plurality of gate lines, a plurality of signal detection lines, and a plurality of pixels on the substrate, each pixel being provided therein with a thin film transistor and an optical sensor, the optical sensor comprising a third electrode, a fourth electrode, and a photosensitive pattern located between the third electrode and the fourth electrode, a gate of the thin film transistor being electrically coupled to one of the gate lines corresponding thereto, a first electrode of the thin film transistor being electrically coupled to one of the signal detection lines corresponding thereto, a second electrode of the thin film transistor being electrically coupled to the third electrode of the optical sensor located in the same pixel, and the plurality of pixels comprising at least one detecting pixel and at least one marking pixel; and
forming a first bias voltage line and a second bias voltage line on a side of the optical sensors away from the substrate, the first bias voltage line and the second bias voltage line being intersected with and insulated from each other, wherein the fourth electrode of the optical sensor in the detecting pixel being electrically coupled to the first bias voltage line corresponding thereto, and the second electrode of the thin film transistor in the marking pixel being electrically coupled to the second bias voltage line corresponding thereto.

19. The method according to claim 18, wherein a direction in which the first bias voltage line extends is parallel to a direction in which the signal detection line extends; a direction in which the second bias voltage line extends is parallel to a direction in which the gate line extends, the second bias voltage line comprises a plurality of first conductive portions arranged at intervals along the first direction, aa conductive bridge line connecting adjacent ones of the first conductive portions and at least one second conductive portion; the first conductive portions and the second conductive portion are arranged in the same layer as the first bias voltage line, the conductive bridge line is located on a side of the first bias voltage line away from the substrate and insulated from the first bias voltage line, an end of the second conductive portion is directly coupled with the first conductive portion, and another end of the second conductive portion extends into the marking pixel corresponding thereto and is electrically coupled with the second electrode of the thin film transistor in the marking pixel, and wherein the forming the first bias voltage line and the second bias voltage line on the side of the optical sensors away from the substrate comprises:

forming a planarization layer on a side of the optical sensors away from the substrate, the planarization layer having a first via hole communicating with the fourth electrode of the optical sensor in the detecting pixel and a second via hole communicating with the third electrode of the optical sensor in the marking pixel;

forming a bias voltage line layer on a side of the planarization layer away from the substrate through a patterning process, wherein the bias voltage line layer comprises: the first bias voltage line, the first conductive portions, and the second conductive portion, the first bias voltage line being coupled to the fourth electrode of the optical sensor corresponding thereto through the first via hole, and the second conductive portion being coupled to the third electrode of the optical sensor corresponding thereto through the second via hole;

forming an insulating protective layer on a side of the bias voltage line layer away from the substrate, wherein third via holes communicating with the first conductive portions are formed in the insulating protective layer; and forming a transparent electrode layer on a side of the insulating protection layer away from the substrate, wherein the transparent electrode layer comprising the conductive bridge line, the conductive bridge line being coupled with two adjacent ones of the first conductive portions corresponding thereto through the third via holes so as to realize an electric connection between the adjacent ones of the first conductive portions.

20. The method according to claim 19, wherein the transparent electrode layer further comprises a transparent shielding electrode pattern.

* * * * *